United States Patent [19]

Gandolfi et al.

[11] Patent Number: 4,805,004
[45] Date of Patent: Feb. 14, 1989

[54] SEMICONDUCTOR DEVICE WITH A PLANAR JUNCTION AND SELF-PASSIVATING TERMINATION

[75] Inventors: Luciano Gandolfi, Corsico; Salvatore Musumeci, Riposto, both of Italy

[73] Assignee: SGS Microelettronica SpA, Agrate Brianza, Italy

[21] Appl. No.: 941,622

[22] Filed: Dec. 11, 1986

[30] Foreign Application Priority Data

Dec. 11, 1985 [IT] Italy ............................... 6628 A/85

[51] Int. Cl.$^4$ ........................ H01L 29/36; H01L 29/70
[52] U.S. Cl. ........................................ 357/53; 357/52; 357/34
[58] Field of Search ............................. 357/52, 53, 34

[56] References Cited

U.S. PATENT DOCUMENTS

| | | | |
|---|---|---|---|
| 4,035,824 | 2/1977 | Suzuki | 357/53 |
| 4,165,516 | 8/1979 | Smulders | 357/52 |
| 4,602,266 | 7/1986 | Coe | 357/52 |
| 4,605,948 | 8/1986 | Martinelli | 357/52 |

FOREIGN PATENT DOCUMENTS 52-30176  3/1977  Japan ................................. 357/52 D

*Primary Examiner*—Andrew J. James
*Assistant Examiner*—Jerome Jackson, Jr.
*Attorney, Agent, or Firm*—Wenderoth, Lind & Ponack

[57] ABSTRACT

A semiconductor device with a planar junction and self-passivating termination includes: a silicon substrate of one type of conductivity; an epitaxial layer of a second type of conductivity which is opposite to the first type of conductivity, lying on the substrate, so as to form with it a planar PN junction; a first region, of the first type of conductivity, that delimits, in its interior, an active portion of the device and extends transversely, from the surface of the epitaxial layer to the substrate with a portion having a high concentration of impurities and, on the surface, in the epitaxial layer, with a portion having a low concentration of impurities; and another region immersed in the epitaxial layer and of the same type of conductivity, but with a higher concentration of impurities. The latter region and the top portion of the first region extend toward each other with progressively decreasing concentrations of impurities. The first region may consist of a thin surface zone diffused on the walls and on the bottom of a deep groove of the type normally made in mesa devices. However, unlike mesa devices of the prior art the device according to the present invention does not require a thick layer of dielectric material in contact with the junction and its electrical properties are therefore improved and more reliable.

10 Claims, 4 Drawing Sheets

SEMICONDUCTOR DEVICE WITH A PLANAR JUNCTION AND SELF-PASSIVATING TERMINATION

BACKGROUND OF THE INVENTION

The present invention pertains to semiconductor electronic devices, comprising a substrate of monocrystalline semiconductor material, of one type of conductivity, and a semiconductor layer of a second type of conductivity which is opposite to the first type of conductivity, lying on the substrate, so as to form with it, a planar PN junction.

This invention is applied to junction diodes, bipolar transistors, power transistors, transistors in a Darlington configuration, integrated circuits and similar semiconductor devices in which there is at least one planar junction.

It is known that devices of the type indicated have a PN junction terminated by a cut or groove and for this reason are better known as mesa devices. This type of termination permits junctions with high inverse breakdown voltages to be achieved.

One disadvantage of such devices is the need to passivate the surface of the groove with a very thick layer of dielectric material, to assure electrical properties which are stable in time. The passivation process, for example, achieved with glass, is difficult and the possible reprocessing of reject devices is costly. Moreover, the materials used for the passivation contain contaminants (for example, the glass contains mobile ions: $Na^+$, $K^+$, etc.) which are difficult to control. The constancy of the physical and electrical properties of the devices produced are therefore not assured. Finally, the reliability of the devices fabricated in this way is not very high because their initial characteristics are subject to variations due to migration of the contaminants.

SUMMARY OF THE INVENTION

The object of this invention is to provide a device having planar junctions with high inverse breakdown voltages, without resorting to the use of dielectric materials to terminate the junctions.

This and other objectives are achieved by providing a semiconductor device comprising: a substrate of monocrystalline semiconductor material of a first type of conductivity; a semiconductor layer of a second type of conductivity which is opposite to that of said first type of conductivity, located on the substrate in such a way as to form a planar PN junction therewith; a layer of insulating material which at least partially covers a surface of said semiconductor layer opposite said PN junction; a first and a second conducting means for respectively making ohmic contacts with said substrate and said semiconductor layer, wherein said device comprises a first region of said first type of conductivity which delimits an active part of said device and extends from said surface across the entire semiconductor layer and part of said substrate in such a way as to intersect said PN planar junction; and wherein said device has a second and a third region in said active part which extend on said surface and are parallel to said substrate with a concentration of impurities everywhere larger than that of said semiconductor layer, said second region of said first type of conductivity extending from said first region to an interior of said active part with a concentration of impurities that decreases to an edge remote from said first region with a first predetermined profile and said third region of said second type of conductivity extending to said interior of said active part with a concentration of impurities that decreases to said edge with a second predetermined profile; and wherein ohmic contact of said second conducting means with said semiconductor layer is located on a zone of said third region having the higher concentration of impurities.

BRIEF DESCRIPTION OF THE DRAWINGS

The present invention will be best understood by the following detailed specification of certain of its exemplary embodiments and thus non-limiting, and considered in relation to the attached drawings, wherein.

DESCRIPTION OF THE PREFERRED EMBODIMENTS

Figure 1:
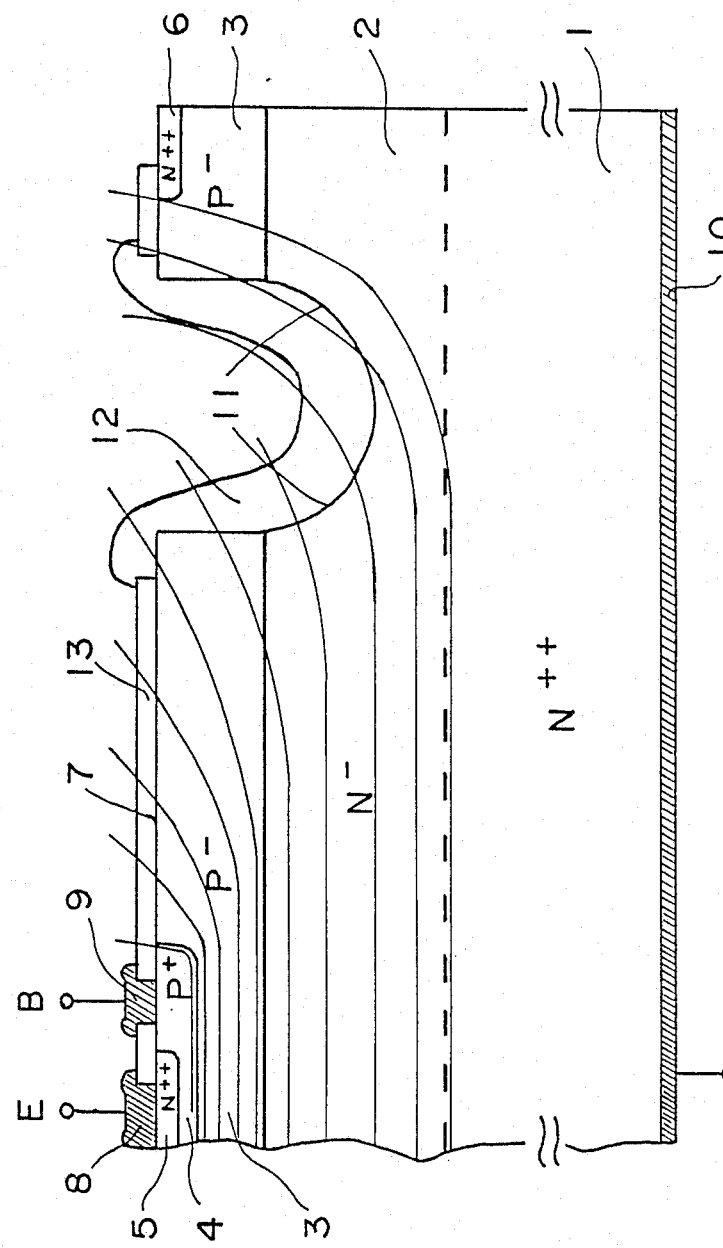
FIG. 1 illustrates a section, not to scale, of a portion of a silicon chip comprising a mesa NPN power transistor with the planar collector-base junction passivated with glass, according to known techniques.

With reference to FIG. 1, a section is illustrated, not to scale, of a portion of a chip comprising an NPN power transistor of the mesa groove, made according to known techniques.

It is formed on a substrate 1 of monocrystalline silicon of conductivity $N^{++}$, with impurities on the order of $2.5 \times 10^{19}$ atoms/cm$^3$. On the substrate 1 is grown an epitaxial layer 2, of conductivity $N^-$, with impurities on the order of $1 \times 10^{14}$ atoms/cm$^3$. The substrate 1 with the epitaxial layer 2 constitutes the collector region of the transistor, of which the collector electrode is represented by a metallic layer 10.

An epitaxial layer 3, of conductivity $P^-$, with impurities on the order of $2 \times 10^{14}$ atoms/cm$^3$, constituting the base region of the transistor is grown on the epitaxial layer 2 of the collector. A diffused region 4, of conductivity + and with impurities of surface concentration on the order of $1 \times 10^{18}$ atoms/cm$^3$, is formed in the epitaxial layer 3 and constitutes a localized enhancement of the base region of the transistor, to locally reduce the electric field. A metallic element 9 in ohmic contact with the region 4 constitutes the base electrode of the transistor.

The enhanced base region 4 contains a diffused region 5 of conductivity $N^{++}$ with a surface concentration of impurities on the order of $1 \times 10^{20}$ atoms/cm$^3$, which constitutes the emitter region of the transistor. A metallic element 8 in ohmic contact with the region 5 constitutes the emitter electrode of the transistor.

A region 6, also of conductivity $N^{++}$, and achieved by diffusion of impurities of the same type and concentration as the emitter of region 5, constitutes the "channel stopper" of the transistor.

It is noted that the term "diffused region" hereinafter applied to a region obtained by diffusion of doping impurities starting from the vapor or liquid phase, or a predeposition, or ion implantation, or according to some other known technique.

The structure of FIG. 1 is covered by a layer 13 of silicon dioxide, that is spread over the entire surface 7 of the epitaxial layer 3, with the exception of the openings necessary for the contacts. It also has a groove or depression 11, that surrounds the entire active part of the device, that is, the NPN power transistor. On the walls and on the bottom of the groove 11, there is a deposition of insulating material 12, for example glass, which is used to passivate the planar base-collector junction 3-2.

Finally, FIG. 1 illustrates the course of the equipotential lines for a predetermined reverse voltage of the collector-base junction of the transistor.

Figure 2:
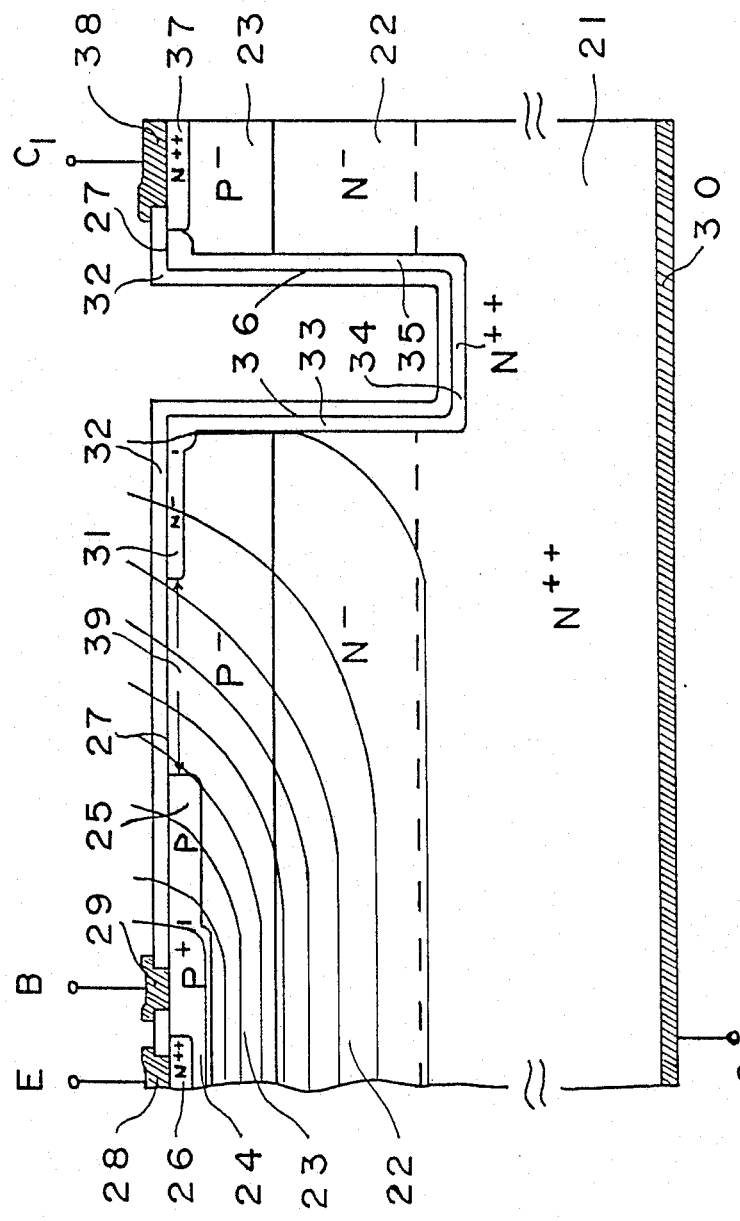
FIG. 2 illustrates a section, not to scale, of an NPN power transistor according to the present invention.

FIG. 2 shows a section, not to scale, of a portion of a silicon chip comprising an NPN power transistor according to the present invention.

It is formed on a substrate 21 of monocrystalline silicon, of a high conductivity N++, doped with antimony, for example, of a maximum concentration of $2 \times 10^{19}$ atoms/cm$^3$.

An epitaxial layer 22 is grown on the substrate 21, involving the entire area of the chip, of a conductivity N−, doped with phosphorous, for example, of a concentration of $1 \times 10^{14}$ atoms/cm$^3$, which is much lower with respect to that of the substrate 21. The concentration and thickness of the epitaxial layer 22 are determined as a function of the breakdown voltage that is desired for the collector-base junction of the transistor, wherein 21 and 22, together, constitute the collector region and 30 constitutes the electrode of the primary collector C.

On the epitaxial layer 22 of the collector, an epitaxial layer 23, of opposite conductivity P− is grown, by means of doping with boron, for example, with a concentration of $1 \times 10^{14}$ atoms/cm$^3$ involving the entire area of the chip. Boron impurities of a dosage of $5 \times 10^{14}$ atoms/cm$^2$ are implanted in a zone 24 of this epitaxial layer for a predetermined horizontal area. The implantation of boron is repeated with a dosage of $3 \times 10^{12}$ atoms/cm$^2$, in an additional adjacent zone 25 which may be 90 μm wide, for example. This second implantation may be made, for simplicity of the process, on the entire zone 24–25; thus, in the zone 24, boron is implanted at a dosage of $5.03 \times 10^{14}$ and in the zone 25 at a dosage of $3 \times 10^{12}$ atoms/cm$^2$. A subsequent high-temperature heat treatment causes the impurities implanted to diffuse, whereby a diffused base region is formed with a step-like profile of concentration with concentration greater in the region 24.

The epitaxial layer 23 and the regions 24-25 together constitute the base region of the transistor according to the present invention. The base electrode consists of a metallic element 29 in ohmic contact with the region 24.

A thin region 31 is then formed that delimits, on the surface, the entire active area of the transistor. In may be approximately 90 μm wide and approximately 5 μm deep, and may be produced by implantation of phosphorous, for example, at a dosage of $2 \times 10^{11}$ atoms/cm$^2$ and subsequent diffusion.

A groove 36 of a depth such as to pass through the substrate 21 is then formed, with a saw or by etching, following the exterior edge of the region 31.

After having made this groove, an impurity of conductivity N++, is diffused on the walls 33 and 35 and on the bottom 34 thereof. It consists of phosphorous, for example, with a high surface concentration, equal to $1 \times 10^{20}$ atoms/cm$^3$ which diffuses and penetrates the interior for a thickness of 5 μm, for example.

In this way, the collector of the transistor according to the invention consists of the regions 21 - 22 - 33 - 34 - 35 - 31 - 37. It has a primary electrode C, constituted by a metallic layer 30 that covers the entire surface of the bottom of the chip, and an auxiliary electrode $C_1$, lying on the surface 27 and consisting of a metallic element 38. The latter is not used in the case of a transistor designed to dissipate great power, whereas it is useful in other applications of the device according to the present invention.

The metallic element 38, constituting the collector electrode $C_1$, is in ohmic contact with a previously formed diffused region 37, of high conductivity N++, doped with phosphorous, for example, with a high surface concentration of $10^{19}$ atoms/cm$^3$, which does not form any active PN junction with the underlying semiconductor layer 23, which is locally short circuited at the underlying epitaxial layer 22 by the diffused region 35, with a high conductivity of N++, on the wall of the mesa groove.

A region 26 of conductivity N++ is diffused within the enhanced base region 24 and constitutes the emitter region of the transistor. A metallic element 28 in ohmic contact with the region 26 constitutes the emitter electrode 28.

The structure of FIG. 2 is completed with a high-temperature growth of a layer of silicon dioxide 32, of a thickness between 0.2 and 2 μm, inclusive, that uniformly covers the surface 27 and the walls and the bottom of the groove 36.

Finally, given the purity of the silicon dioxide 32, the structure according to the invention affords exceptional stability and reliability, and also permits withstanding high breakdown voltages of the collector.

Moreover, as a result of the extension of the collector region 21-22 down to the top surface 27, the equipotential lines, illustrated in the figure and produced by the electrical field when the collector-base junction is biased with high reverse voltages, are all forced to concentrate in the space comprised between the base electrode 29 and the diffused wall 33; and owing to the distribution of the concentration of impurities in the aforesaid space so as to vary the amount of charge according to a course that forces the aforesaid equipotential lines to be equally spaced, the superficial electric field located tangentially on the surface 27, is less than a predetermined value.

The substantial difference of the distribution and shape of the equipotential lines is to be noted between the transistor of FIG. 1 and of FIG. 2, the applied reverse voltage being equal.

It is also to be noted that as a result of the modified electric field, the transistor of FIG. 2 is enabled to withstand reverse voltages which are higher than that of FIG. 1.

Although just one embodiment of this invention is illustrated and described, it is obvious that numerous variants and modifications may be made to it, without departing from the scope of the invention. For example, still with reference to FIG. 2, the distance 39, that separates the two regions 24-25 and 31, may be made equal to zero, whereby the two aforesaid regions touch each other. This may occur, with obvious size reductions of the chip, when the breakdown voltage of the transistor does not have to be very high.

However, if the breakdown voltage of the collector-base must be high, still with reference to FIG. 2, the structure is modified with the addition of further implanted regions, that extend the base regions 24-25 and collector region 31 according to predetermined laws of concentration and variation.

This is to say, there may be a variable number of additional implanted zones, with a minimum of at least one per part (and in this case the structure becomes the one shown in FIG. 2) near the enhanced base region 24 and collector region 33. This number of additional implanted zones $\geq 1$ in the base region of the transistor depends especially on the maximum voltage that the device must withstand without breakdown; the greater the number of additional implanted zones, the higher the voltage that the junction can withstand.

Figure 4:
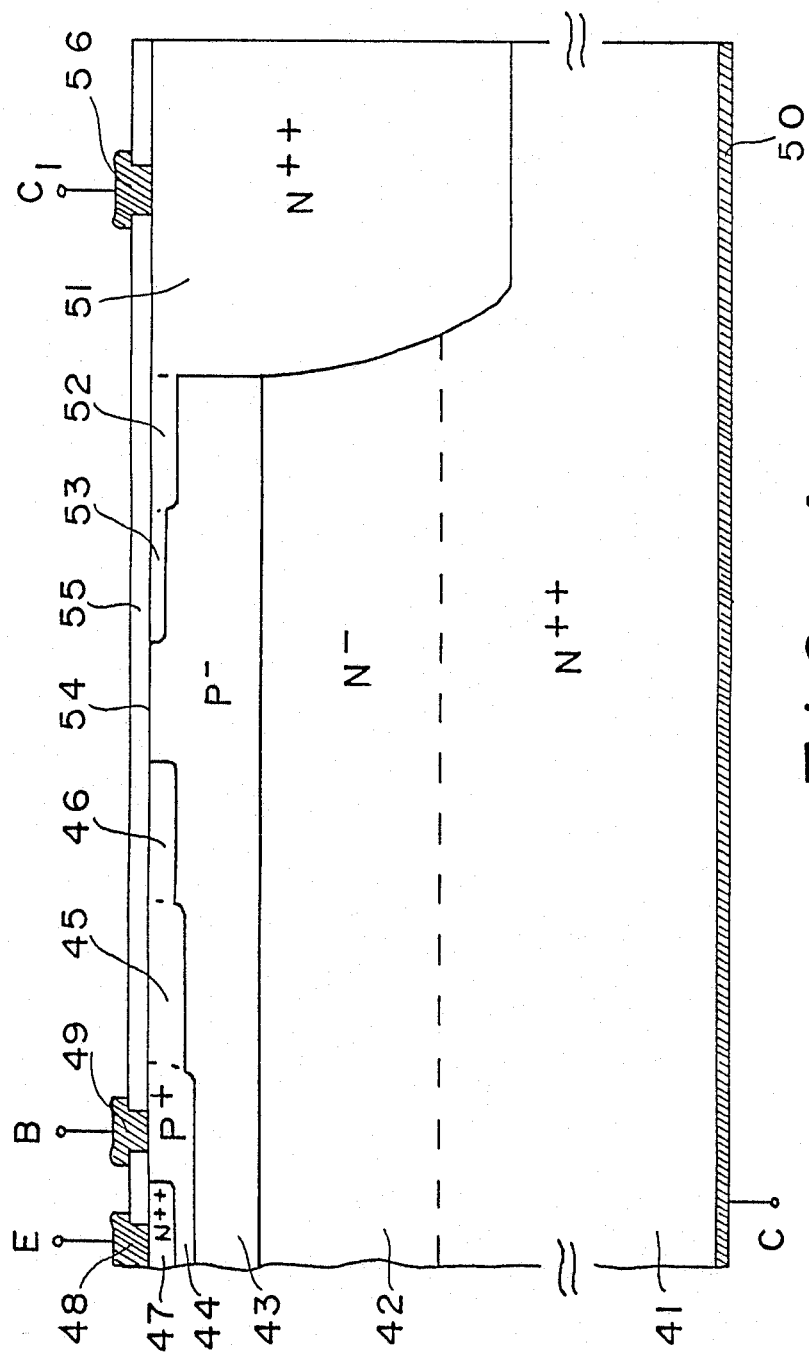
FIG. 4 illustrates a section, not to scale, of an NPN power transistor, according to another variation of the present invention.

FIG. 4 illustrates an example of a transistor with two additional implanted zones, indicated by 45 and 46 for the base and by 52 and 53 for the collector.

Figure 3:
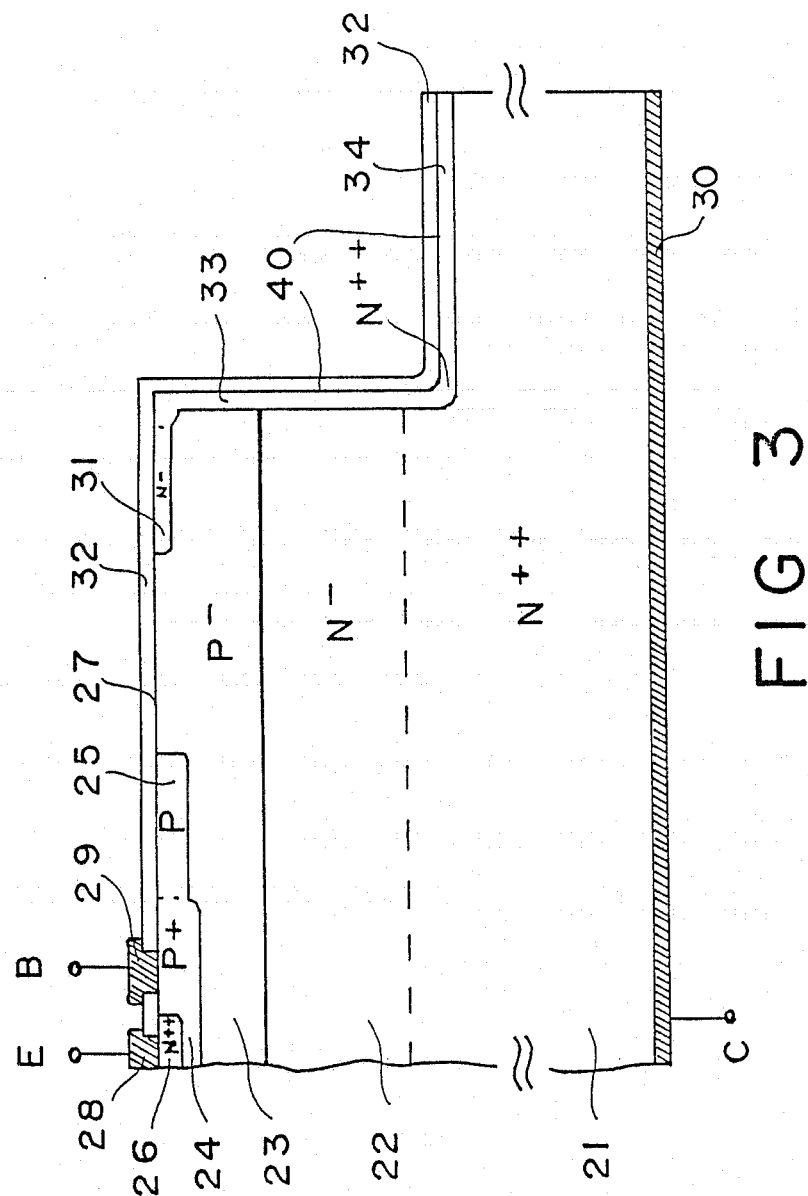
FIG. 3 illustrates a section, not to scale, of a transistor similar to the one represented in FIG. 2, according to a variation of the present invention.

A variation of the transistor of FIG. 2 is illustrated in FIG. 3. It differs from the forms described so far, only because it does not have the groove and the auxiliary collector electrode $C_1$, since the mesa configuration 40 is made in steps.

Another variation of the transistor of FIG. 2 is illustrated in FIG. 4, that represents another embodiment of the invention. With reference to FIG. 4, the substrate 41, the epitaxial layers 42 and 43, the regions 44, 45, 46, and 47 and the electrodes 48, 49, and 50 are equal to the homologous elements of the structure of FIG. 2.

According to this variation, a region 51 is formed by means of a deep diffusion of a doping agent, of conductivity N++, until reaching the substrate 41, so as to extend, in this way, the collector region of the transistor from the substrate up until the surface 54. The regions 52 and 53, of conductivity N, extend this collector region 51 under the layer of silicon dioxide 55, through which, by means of a metallic element 56, an auxiliary collector electrode $C_1$ is formed.

It is obvious that the present invention, described for NPN transistors, applies with the necessary modifications known to experts in the field, to the fabrication of PNP transistors.

It is obvious that the layer, epitaxially grown on the substrate and that with the substrate constitutes the collector region of the transistors shown in FIGS. 1-4, may be totally lacking, or, alternatively, said epitaxial layer may, in turn, consist of more than one epitaxial layer, each with a conductivity decreasing in drawing nearer to the PN junction; this depends on the more or less intense electric field present in the device.

It is also obvious that the horizontal geometry of the devices according to the present invention may take any form, as is the case of the interdigitated structures constituting the base and emitter regions of a multicellular transistor.

Finally, in conclusion, the present invention does not apply solely to discrete devices, such as diodes, transistors, but to any semiconductor device in which it becomes necessary to make discrete type structures.

I claim:

1. A semiconductor device comprising: a substrate of monocrystalline semiconductor material of a first type of conductivity; a semiconductor layer of a second type of conductivity which is opposite to that of said first type of conductivity, located on the substrate in such a way as to form a planar PN junction therewith; a layer of insulating material which at least partially covers a surface of said semiconductor layer opposite said PN junction; a first and a second conducting means for respectively making ohmic contacts with said substrate and said semiconductor layer, wherein said device comprises a first region of said first type of conductivity which delimits an active part of said device and extends from said surface across the entire semiconductor layer and part of said substrate in such a way as to intersect said PN planar junction; and wherein said device has a second and a third region in said active part which extend on said surface and are parallel to said substrate with a concentration of impurities everywhere larger than that of said semiconductor layer, said second region of said first type of conductivity extending from said first region to an interior of said active part with a concentration of impurities that decreases to an edge remote from said first region with a first predetermined profile and said third region of said second type of conductivity extending from a P side of said PN junction to said interior of said active part with a concentration of impurities that decreases to said edge with a second predetermined profile; and wherein ohmic contact of said second conducting means with said semiconductor layer is located on a zone of said third region having a higher concentration of impurities.

2. A device as set forth in claim 1, wherein said first predetermined profile is a continuous curve.

3. A device as set forth in claim 1, wherein said second predetermined profile is a continuous curve.

4. A device as set forth in claim 1, wherein said first predetermined profile is a steplike curve.

5. A device as set forth in claim 1, wherein said second predetermined profile is a steplike curve.

6. A device as set forth in claim 1, wherein said first region is delimited by a surface coplanar with said surface of said semiconductor layer and wherein said layer of insulating material extends above said coplanar surface.

7. A device as set forth in claim 1, wherein said first region is delimited by a groove and wherein said layer of insulating material extends even on walls and on a bottom of said groove.

8. A device as set forth in claim 1, further comprising a third conducting means which makes ohmic contact with said first region.

9. A device as set forth in claim 6, further comprising a third conducting means which makes ohmic contact with said first region.

10. A device as set forth in claim 7, further comprising a third conducting means which makes ohmic contact with said first region.

* * * * *